(12) United States Patent
Hsieh

(10) Patent No.: US 10,505,086 B2
(45) Date of Patent: Dec. 10, 2019

(54) LIGHT SOURCE DEVICE

(71) Applicant: AU OPTRONICS CORPORATION, Hsin-Chu (TW)

(72) Inventor: I-Hsun Hsieh, Pingtung (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/115,911

(22) Filed: Aug. 29, 2018

(65) Prior Publication Data

US 2019/0103527 A1 Apr. 4, 2019

(30) Foreign Application Priority Data

Sep. 29, 2017 (TW) .............................. 106133787 A

(51) Int. Cl.
| | |
|---|---|
| *G02B 5/00* | (2006.01) |
| *H01L 33/56* | (2010.01) |
| *H01L 33/48* | (2010.01) |
| *H01L 33/54* | (2010.01) |
| *H01L 33/60* | (2010.01) |
| H01L 25/075 | (2006.01) |

(52) U.S. Cl.
CPC ............ *H01L 33/56* (2013.01); *H01L 33/486* (2013.01); *H01L 33/54* (2013.01); *H01L 33/60* (2013.01); *H01L 25/0753* (2013.01)

(58) Field of Classification Search
CPC ........ G02B 6/0025; H01L 33/54; H01L 33/60
See application file for complete search history.

(56) References Cited

U.S. PATENT DOCUMENTS

| 2008/0212213 A1* | 9/2008 | Kogure .................... B32B 7/02 |
| | | 359/838 |
| 2014/0177234 A1 | 6/2014 | Wang He |
| 2018/0315903 A1* | 11/2018 | Fan ..................... H01L 33/0095 |

FOREIGN PATENT DOCUMENTS

| CN | 102800795 A | 11/2012 |
| CN | 102916110 A | 2/2013 |
| CN | 104409619 A | 3/2015 |
| CN | 104893600 A | 9/2015 |
| CN | 105567105 A | 5/2016 |
| CN | 106058013 A | 10/2016 |
| TW | 200936953 | 9/2009 |
| TW | 201426021 | 7/2014 |

OTHER PUBLICATIONS

Taiwan Intellectual Property Office, "Office Action", dated Dec. 7, 2018.

* cited by examiner

*Primary Examiner* — Thomas L Dickey
(74) *Attorney, Agent, or Firm* — WPAT, PC

(57) ABSTRACT

A light source device in the present invention includes a substrate, a light-emitting chip, a transparent sealant, and a top cover. The substrate has a supporting surface. The light-emitting chip is disposed on the supporting surface. The transparent sealant covers the light-emitting chip and is located on the supporting surface. The transparent sealant has a light-emitting surface located outside a side surface of the light-emitting chip. The top cover covers a side of the transparent sealant opposite to the substrate, and clamps the transparent sealant together with the substrate, and the light-emitting surface is located between the substrate and the top cover. A reflectance of the top cover is greater than a transmittance of the top cover, and the transmittance of the top cover is greater than 0.1%.

17 Claims, 8 Drawing Sheets

LIGHT SOURCE DEVICE

BACKGROUND OF THE DISCLOSURE

1. Field of the Invention

The present invention relates to a light source device, and specifically, to a light source device that is applicable to a display device.

2. Background

In an existing display device, a backlight module using a light-emitting diode unit mainly includes edge-type light source design and direct-type light source design. Because a direct-type light source can meet a local dimming requirement, more display devices use a backlight module in the direct-type light source design. Generally, in a backlight module of a display device, an optical distance (OD) from the light-emitting diode unit to a closest optical film must be maintained to avoid a situation such as a bright spot. When a light-emitting diode chip is encapsulated into a light-emitting diode unit, primary optical design is first needed, to adjust the light-emitting angle, light intensity, luminous flux, light intensity distribution, and range and distribution of a color temperature. After light generated by the light-emitting diode chip emits from an encapsulated structure, the light still needs to cooperate with a lens outside the light-emitting diode unit to achieve secondary optical design, and then uses an external optical film to adjust light distribution to achieve a light-emitting effect required by a product. However, the existing limit caused by the optical distance affects the application of thinner design in display devices. Therefore, improvement of a structure of an existing backlight module is needed.

SUMMARY

An objective of the present invention is to provide a light source device, so as to reduce relative brightness of forward light.

The light source device includes a substrate, a light-emitting chip, a transparent sealant, and a top cover. The substrate has a supporting surface. The light-emitting chip is disposed on the supporting surface. The transparent sealant covers the light-emitting chip and is located on the supporting surface. The transparent sealant has a light-emitting surface located outside a side surface of the light-emitting chip. The top cover covers a side of the transparent sealant opposite to the substrate, and clamps the transparent sealant together with the substrate, resulting in the light-emitting surface located between the substrate and the top cover. The reflectance of the top cover is greater than the transmittance of the top cover. The transmittance of the top cover is greater than 0.1%.

DETAILED DESCRIPTION

Figure 1A:
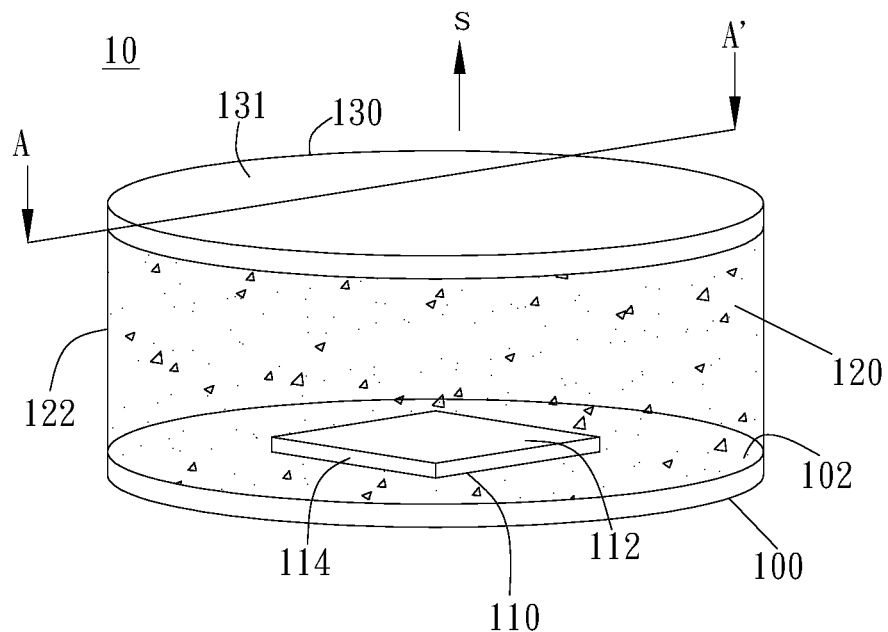
FIG. 1A is a three-dimensional diagram of an embodiment of a light source device according to the present invention.

The present invention provides a light source device, so as to reduce relative brightness of a forward light by improving an encapsulated structure of a light-emitting chip. The foregoing "forward" refers to light having a direction (so called as forward direction) parallel to a normal viewing angle. In a light source device 10 of the present invention shown in FIG. 1A, the forward direction is a direction (s) perpendicular to an outer surface 131 of a top cover 130. The light source device such as a light-emitting diode unit is applicable to a display device. In a three-dimensional diagram of the light source device 10 as shown in FIG. 1A, the light source device 10 includes a substrate 100, a light-emitting chip 110, a transparent sealant 120, and a top cover 130. The substrate 100 has a supporting surface 102. The light-emitting chip 110 is disposed on the supporting surface 102. The light-emitting chip 110 is, for example, a light-emitting diode chip. The transparent sealant 120 is located on the supporting surface 102. The transparent sealant 120 is, for example, a transparent colloid filled with a wavelength converting material such as a fluorescent powder, a phosphor powder, or a quantum dot. As shown in FIG. 1A, the transparent sealant 120 covers the light-emitting chip 110 and is located on the supporting surface 102. The transparent sealant 120 may further cover the supporting surface 102 that is not covered by the light-emitting chip 110. The transparent sealant 120 has a light-emitting surface 122 located outside a side surface 114 of the light-emitting chip 110. The top cover 130 covers a side of the transparent sealant 120 opposite to the substrate 100, and clamps the transparent sealant 120 together with the substrate 100.

Figure 1B:
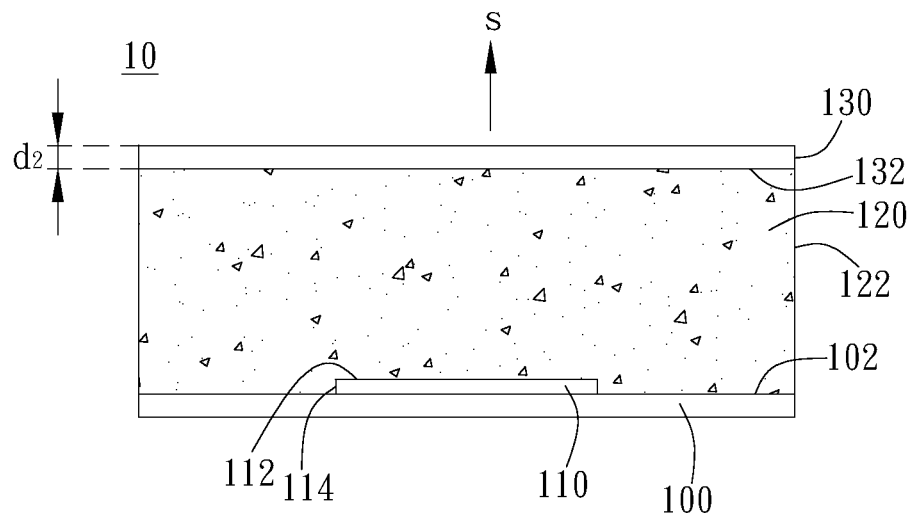
FIG. 1B is a sectional view corresponding to FIG. 1A.

FIG. 1B is a sectional view along a direction A-A' in a corresponding FIG. 1A. As shown in FIG. 1B, the transparent sealant 120 is located between the substrate 100 and the top cover 130, resulting in the light-emitting surface 122 located between the substrate 100 and the top cover 130. The light-emitting surface 122 may surround the light-emitting chip 110. As shown in FIG. 1A and FIG. 1B, the transparent sealant 120 is distributed in space between the substrate 100 and the top cover 130, and covers the light-emitting chip 110. In an embodiment, the light-emitting chip 110 may have a top surface 112 toward the top cover 130 and the side surface 114 toward the light-emitting surface 122. A part of the transparent sealant 120 is, for example, filled between the top surface 112 of the light-emitting chip 110 and the top cover 130, and another part of the transparent sealant 120 is, for example, filled in an area outside a vertical projection range of the top surface 112 of the light-emitting chip 110 on the supporting surface 102, and is located between the substrate 100 and the top cover 130. In the embodiment of FIG. 1A and FIG. 1B, the transparent sealant 120 located between the top surface 112 of the light-emitting chip 110 and the top cover 130, for example, fills space between the top surface 112 and the top cover 130 That is, the transparent sealant 120 fills from the top surface 112 to an inner surface 132 of the top cover 130.

The top cover 130 such as a molding plastic has features of partially reflection and partially transmittance. Specifically, the reflectance of the top cover 130 is greater than the transmittance of the same. The transmittance of the top cover 130 is greater than 0.1%. The foregoing "transmittance" refers to a ratio of an amount of light emitted by the light source device 10 from the top cover 130 to an amount of light reaching the top cover 130 from the inside of the light source device 10. By using this design, in light generated from the light-emitting chip 110, except a part emitting light toward the light-emitting surface 122, a majority of light toward top cover 130 is reflected by the top cover 130 after through the transparent sealant 120, and a minority of light emits light from the top cover 130. By using this design, relative brightness of a forward light can be effectively reduced, an optical distance can be shortened, and an entire thickness of a backlight module can be reduced. In this way, light can be prevented from being excessively concentrated on a normal viewing angle and easily leading to a phenomenon of a bright spot or uneven brightness, a lens outside the light source device in the display device is omitted, and manufacturing costs are reduced. It should be noted that if the top cover 130 is made from a reflective material and not have transmission of light, though the forward light can be effectively reduced, an apparent dark spot is likely to generate at a position of the light source device 10. Therefore, by using design that the reflectance of the top cover 130 is greater than the transmittance of the same, and the transmittance of the top cover 130 is greater than 0.1%, relative brightness of a forward light can be effectively reduced, and a minority of light is enabled to emit light from the top cover 130, helping to improving light evenness of a backlight module. In addition, the transmittance of the top cover 130 may have an upper limit value. In an embodiment, the transmittance of the top cover 130 is, for example, less than 15%.

In addition, the transmittance of the top cover 130 is, for example, related to a thickness, and the transmittance becomes less when the thickness of the top cover 130 becomes greater. As shown in FIG. 1B, the top cover 130 has a thickness d2. In an embodiment, the top cover 130 may have a thickness d2 of 0.01 mm to 3 mm to obtain a better transmittance. In a preferred embodiment, the top cover 130 may have a thickness of 0.05 mm to 0.6 mm. In this way, relative brightness of a forward light is reduced, and an effect of guiding light to the light-emitting surface 122 corresponding to the side surface 114 of the light-emitting chip 110 is provided. In addition, in an embodiment, the supporting surface 102 of the light source device 10 may have a circular shape, and vertical projection of the light-emitting chip 110 on the supporting surface 102 may have a square shape, and a geometric center of the square projection of the light-emitting chip 110 overlaps a center of the circular supporting surface 102, making the light-emitting chip 110 capable of more evenly emitting light.

Figure 2:
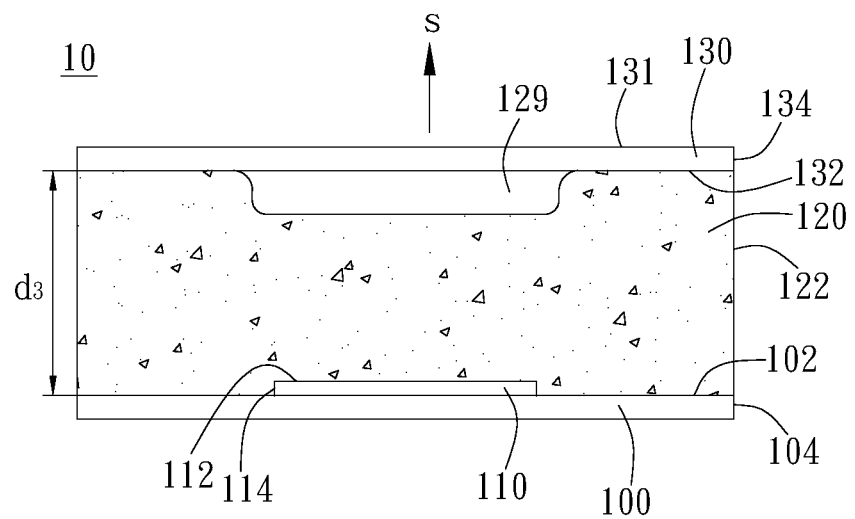
FIG. 2 is a sectional view of another embodiment of a light source device.

FIG. 2 is a sectional view of another embodiment of a light source device 10. As shown in FIG. 2, the transparent sealant 120 is located between the substrate 100 and the top cover 130, resulting in the light-emitting surface 122 located between the substrate 100 and the top cover 130. The light source device 10 mainly emits light from the light-emitting surface 122, and provides illumination for a horizontal periphery (which is corresponding to the outside of two sides where the light-emitting surface 122 is located in FIG. 2) near the transparent sealant 120. In addition, the top cover 130 has partial transmission of light, and also provides illumination above the top cover 130. The light source device 10 may have a forward light-emitting direction. In the light source device 10 in FIG. 2, the forward direction is the direction (s) perpendicular to the outer surface 131 of the top cover 130. As shown in FIG. 2, the transparent sealant 120 is distributed in the space between the substrate 100 and the top cover 130, and covers the light-emitting chip 110. Specifically, a part of the transparent sealant 120 is filled between the top surface 112 of the light-emitting chip 110 and the top cover 130, and another part of the transparent sealant 120 is filled outside a vertical projection range of the top surface 112 of the light-emitting chip 110 on the top cover 130, and is located between the substrate 100 and the top cover 130. In an embodiment, the light-emitting surface 122 of the transparent sealant 120 may be aligned with a side end surface of the substrate 100 or a side end surface of the top cover 130, but not limited thereto, and may be adjusted according to a requirement.

In the embodiment of FIG. 2, the light-emitting surface 122 of the transparent sealant 120 is aligned with a side end surface 104 of the substrate 100 and a side end surface 134 of the top cover 130. As shown in FIG. 2, the transparent sealant 120 located between the top surface 112 of the light-emitting chip 110 and the top cover 130 is partially filled in the space between the top surface 112 and the top cover 130. As shown in FIG. 2, the transparent sealant 120 directly covers the top surface 112 of the light-emitting chip 110, and is distributed in a direction from the top surface 112 to the top cover 130. On a side close to the top cover 130 is an area without the transparent sealant 120. The area without the transparent sealant 120 is, for example, a recessed area 129. The recessed area 129 may be, for example, formed by local pressurizing, but not limited thereto. As shown in FIG. 2, the recessed area 129 is substantially located in a vertical projection direction of the top surface 112 toward the top cover 130, and is located between the top cover 130 and the transparent sealant 120. By using this design, an amount of wavelength converting material in a forward light-emitting direction can be reduced, so as to reduce relative brightness of a forward light.

Referring to FIG. 1B and FIG. 2, in an embodiment, the light-emitting chip 110 of the anisotropy light-emitting intensity may be selected to reduce relative brightness of a forward light. For example, the light-emitting intensity of the side surface 114 of the light-emitting chip 110 is greater than the light-emitting intensity of the top surface 112. In this way, an effect of reducing relative brightness of a forward light is achieved, and the light source utilization of the light-emitting chip 110 can also be increased.

Figure 3A:
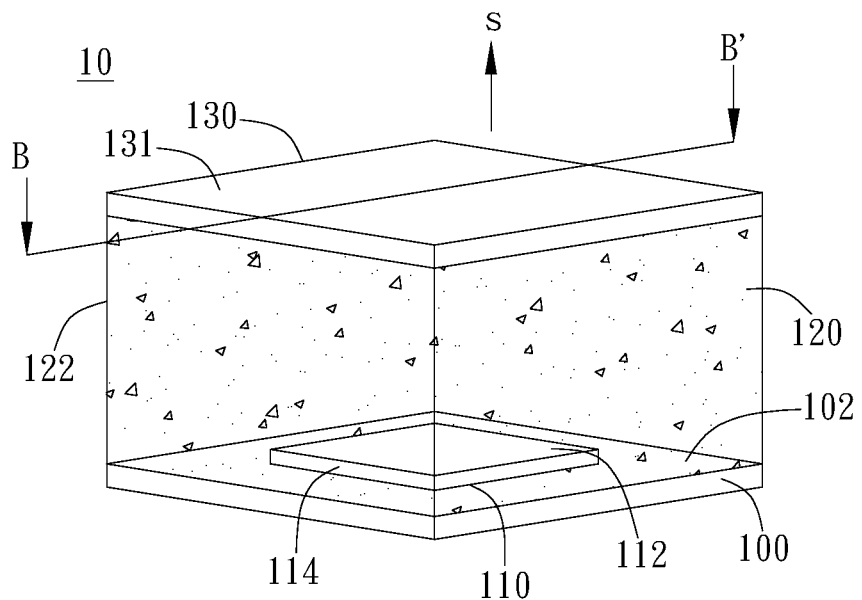
FIG. 3A is a three-dimensional diagram of another embodiment of a light source device.

FIG. 3A is a three-dimensional diagram of another embodiment of a light source device 10. As shown in FIG. 3A, the supporting surface 102 of the light source device 10 has, for example, a square shape, the outer surface 131 of the top cover 130 has, for example, a square shape, and vertical projection of the light-emitting chip 110 on the supporting surface 102 has, for example, a square shape. The light-emitting surface 122 of the transparent sealant 120 surrounds the light-emitting chip 110. The light-emitting surface 122 has, for example, a cuboid shape. The side surface 114 of the light-emitting chip 110 may be parallel to the light-emitting surface 122 of the transparent sealant 120, but not limited thereto. In other words, the substrate 100, the top cover 130 and the light-emitting chip 110 may have a same or similar shape as shown in FIG. 3A. Herein, the similar shape includes, but is not limited to, a geometric similar shape, and may also be a modification on an edge and a corner structure to achieve similarity. In this way, a distance from each side surface 114 of the light-emitting chip 110 to the light-emitting surface 122 is the same, so that lateral light can be more evenly distributed. Similarly, in another embodiment, a circular light-emitting chip may be used, and cooperates with a substrate and a top cover that have a corresponding shape. In this case, the supporting surface of the light source device has a circular shape, the outer surface 131 and the inner surface 132 of the top cover 130 have a circular shape, and vertical projection of the light-emitting chip on the supporting surface has a circular shape. In this way, an effect that lateral light distributed more evenly can be achieved.

Figure 3B:
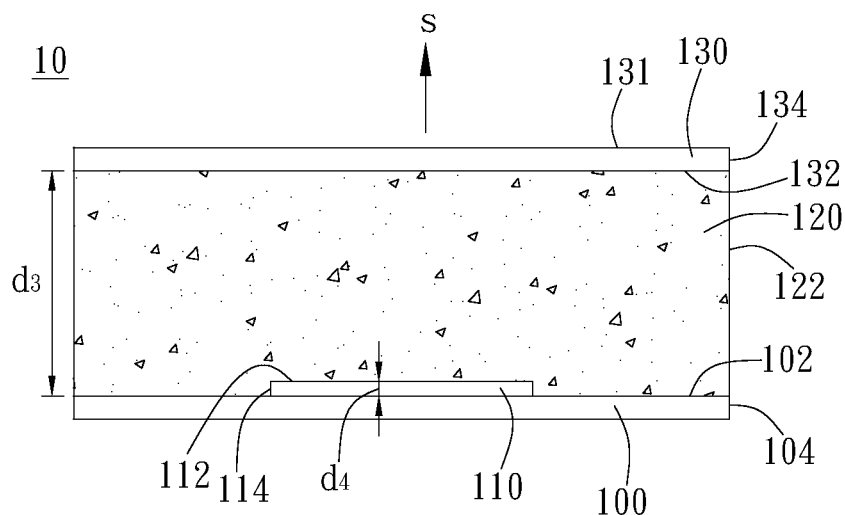
FIG. 3B is a sectional view corresponding to FIG. 3A.

FIG. 3B is a sectional view along a direction B-B' in a corresponding FIG. 3A. In the embodiment of FIG. 3A and FIG. 3B, the light-emitting surface 122 of the transparent sealant 120 is aligned with the side end surface 104 of the substrate 100 and the side end surface 134 of the top cover 130. As shown in FIG. 3B, the transparent sealant 120 has a thickness d3, and the light-emitting chip 110 has a thickness d4. The thickness d3 of the transparent sealant 120 may be related to the thickness d4 of the light-emitting chip 110. In an embodiment, the transparent sealant 120 has a thickness d3 of twice to six times a thickness d4 of the light-emitting chip 110, i.e. $2(d4) \leq d3 \leq 6(d4)$. In this way, an effect having evenly distributed light is provided. In a preferred embodiment, the transparent sealant 120 has a thickness d3 of 2.3 times to 4.5 times a thickness d4 of the light-emitting chip 110, i.e. $2.3(d4) \leq d3 \leq 4.5(d4)$. In addition, a thickness relationship between the light-emitting chip 110 and the transparent sealant 120 corresponding to FIG. 1A and FIG. 1B may also conform to the foregoing descriptions. For the case without the transparent sealant locally in FIG. 2, the thickness of the transparent sealant 120 is, the same as the thickness in FIG. 3, the entire thickness of the transparent sealant 120. Therefore, the foregoing relationship formula is also applicable to obtain a suitable thickness of the transparent sealant shown in FIG. 2.

Figure 4:
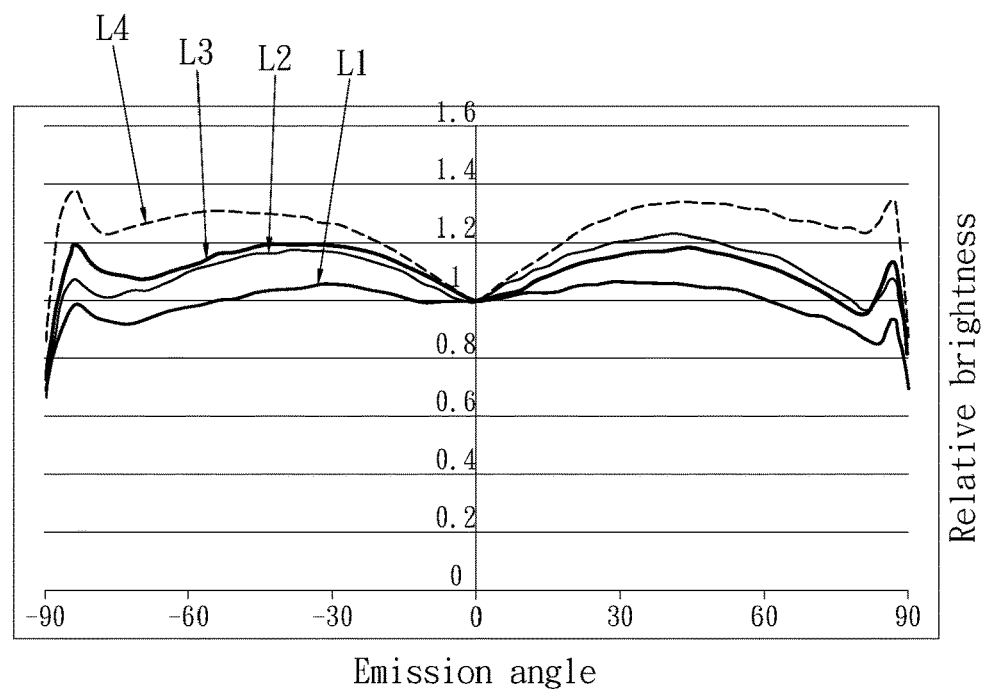
FIG. 4 is a brightness distribution diagram of a transparent sealant in different thickness ranges.

FIG. 4 is a brightness distribution diagram of a transparent sealant in different thickness ranges. In FIG. 4, a longitudinal axis indicates relative brightness, and a horizontal axis indicates an emission angle. The emission angle is an angle between light and a forward direction (for example, the direction (s) in FIG. 3B). The light source device in the present invention reduces relative brightness around the normal viewing angle (0°), and improves relative brightness of a side viewing angle. In the simulated result shown in FIG. 4, when the transparent sealant has a thickness of 2.3 times to 4.5 times a thickness of the light-emitting chip, brightness distribution is approximately located at a position of a curve L1. In this case, light brightness in each direction of the light source device is relatively the same. That is, a difference between a brightest value and a darkest value of relative brightness is relatively small, and evenly light distribution can be provided. When the transparent sealant has a thickness of twice to 2.3 times or 4.5 times to 6 times the thickness of the light-emitting chip, luminance distribution is approximately located at a position from a curve L2 to a curve L3. In this case, light brightness in each direction of the light source device is relatively different. That is, a difference between a brightest value and a darkest value of relative brightness becomes slightly larger than the previous case. In other words, using FIG. 3B as an example, when a lower limit value of the thickness d3 of the transparent sealant 120 is between 2(d4) and 2.3(d4), or an upper limit value of the thickness d3 is between 4.5(d4) and 6(d4), a luminance difference slightly increases. The thickness d3 of the transparent sealant 120 is even beyond the foregoing range, luminance distribution is approximately located at a position of a curve L4. In this case, lateral light brightness is apparently higher than forward light brightness, resulting in a much larger brightness difference.

Figure 5:
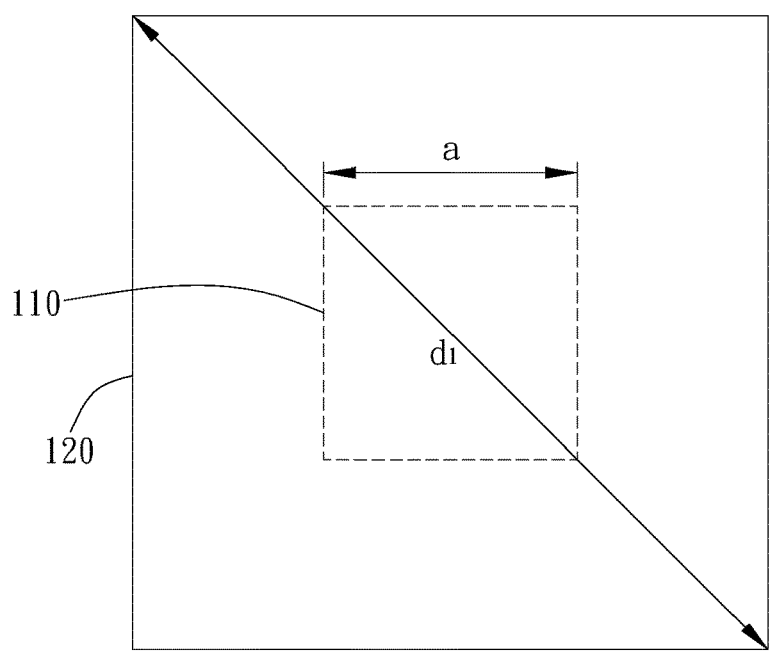
FIG. 5 is a top view of an embodiment of a light source device.

FIG. 5 is a top view (a top cover is omitted in the figure) of an embodiment of a light source device 10. As shown in FIG. 5, the transparent sealant 120 has a largest sectional width d1, the light-emitting chip 110 has a long edge, and a length of the long edge is (a) (the top surface of the light-emitting chip 110 in this embodiment has a square shape). The largest sectional width d1 of the transparent sealant 120 affects evenness of entire light distribution. For a rectangle, the largest sectional width d1 refers to a length of a diagonal line, and for a circle, the largest sectional width d1 refers to a diameter. In an embodiment, the transparent sealant 120 has a largest sectional width d1 of 9.22 times the length (a) of the long edge to the length (a) of the long edge plus 0.04 mm, i.e. $(a)+0.04 \leq d1 \leq 9.22(a)$. In a preferred embodiment, the transparent sealant 120 has a largest sectional width d1 of 3.15 times the length (a) of the long edge to 1.04 times the length (a) of the long edge, i.e. $1.04(a) \leq d1 \leq 3.15(a)$. In this way, entire light distribution is more even.

Figure 6:
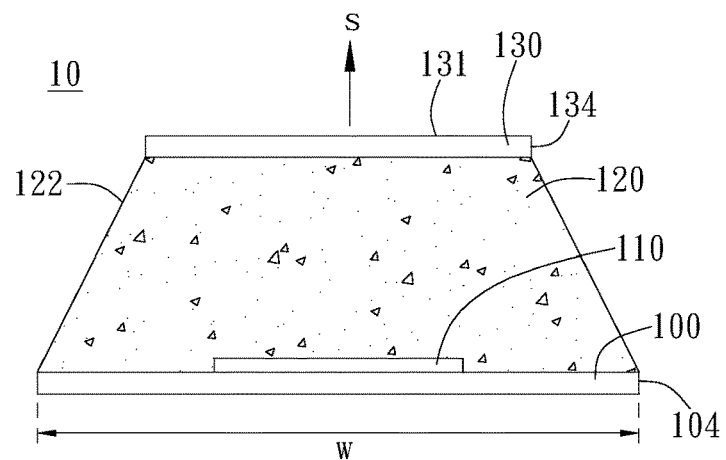
FIG. 6 is a sectional view of another embodiment of a light source device.

FIG. 6 is a sectional view of another embodiment of a light source device 10. As shown in FIG. 6, the transparent sealant 120 is located between the substrate 100 and the top cover 130, resulting in the light-emitting surface 122 located between the substrate 100 and the top cover 130. As shown in FIG. 6, the transparent sealant 120 is distributed in the space between the substrate 100 and the top cover 130, and covers the light-emitting chip 110. Difference from the foregoing embodiment is that the light-emitting surface 122 of the transparent sealant 120 is not aligned with a side end surface 104 of the substrate 100 and a side end surface 134 of the top cover 130. As shown in FIG. 6, a side of the transparent sealant 120 close to the substrate 100 is wider than a side of the transparent sealant 120 close to the top cover 130, and a width (w) of the transparent sealant 120 gradually reduces in a direction from the substrate 100 to the top cover 130. In this way, when conforming to the foregoing dimension scale, the substrate 100, the top cover 130 and the transparent sealant 120 may be further adjusted to have different widths so as to reduce the ingredient amount. In addition, because the width (w) of the transparent sealant 120 changes with a distance far away from the substrate 100 in the direction from the substrate 100 to the top cover 130, a difference between an optical path from light emitted by the light-emitting chip 110 to a relatively low position (a side close to the substrate 100) of the light-emitting surface 122 and an optical path from light emitted by the light-emitting chip 110 to a relatively high position (a side close to the top cover 130) of the light-emitting surface 122 is smaller. In this way, entire light distribution is more even. In another embodiment, the transparent sealant may use different distribution methods to adjust light distribution. For example, the transparent sealant is aligned with the side end surface of the substrate, and is not aligned with the side end surface of the top cover, thereby adjusting a difference between optical paths from light emitting chip to difference positions on the light-emitting surface.

Figure 7A:
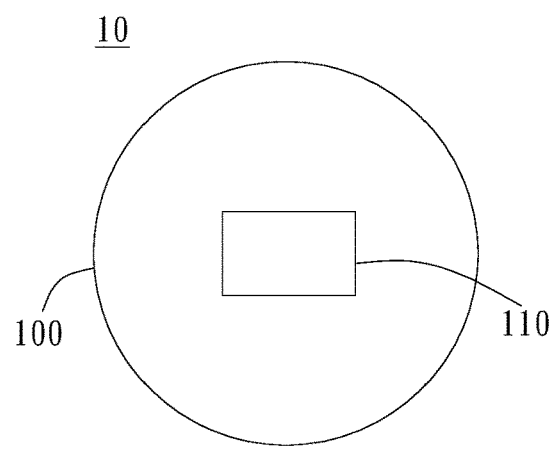
FIG. 7A and FIG. 7B are schematic diagrams of positional relationships between a single light-emitting chip and a substrate.
Figure 7B:
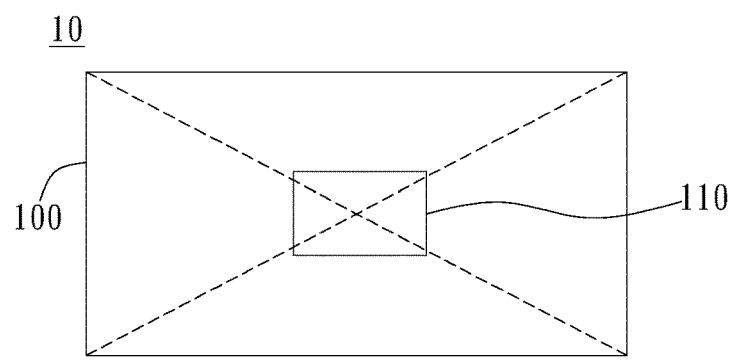

FIG. 7A and FIG. 7B are schematic diagrams of positional relationships between a single light-emitting chip 110 and the substrate 100. A position of the light-emitting chip 110 is preferably disposed at a geometric center of the substrate 100. As shown in FIG. 7A, the supporting surface of the light source device 10 has a circular shape, the top surface of the light-emitting chip 110 has a rectangular shape, and the light-emitting chip 110 is located at a center of the supporting surface. In an example shown in FIG. 7B, the supporting surface of the light source device 10 has a rectangular shape, the top surface of the light-emitting chip 110 has a rectangular shape, and the light-emitting chip 110 is located at a point at which diagonal lines of the supporting surface intersect with each other. In this way, for light emitted by the light-emitting chip 110 in different directions, optical paths from the light-emitting chip 110 to the light-emitting surface are relatively the same, so that entire light distribution is more even.

Figure 8A:
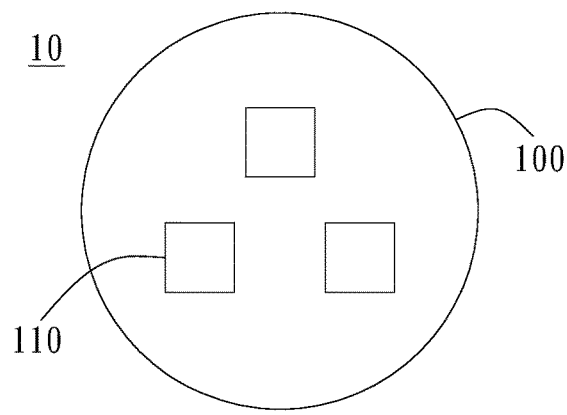
FIG. 8A, FIG. 8B, FIG. 8C, FIG. 8D, FIG. 8E and FIG. 8F are schematic diagrams of positional relationships between a plurality of light-emitting chips and a substrate.
Figure 8B:
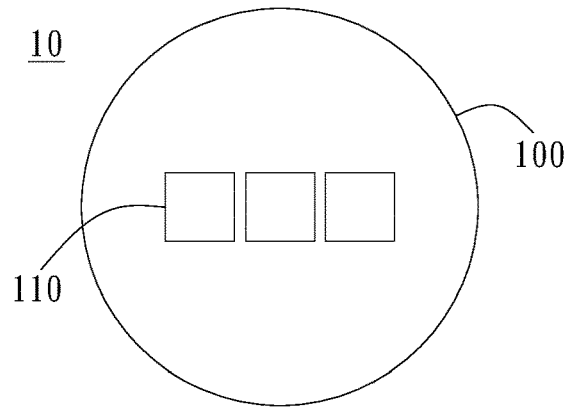

FIG. 8A, FIG. 8B, FIG. 8C, FIG. 8D, FIG. 8E and FIG. 8F are schematic diagrams of positional relationships between a plurality of light-emitting chips 110 and the substrate 100. As shown in FIG. 8A to FIG. 8F, the light source device 10 includes the plurality of light-emitting chips 110 disposed on a circular substrate 100 or a rectangular substrate 100. FIG. 8A and FIG. 8B show an example of three light-emitting chips 110. When the light source device 10 includes a plurality of light-emitting chips 110, the light-emitting chips 110 are preferably arranged in a symmetric manner to provide a relatively regular optical field distribution. In this way, when there are a plurality of light source devices 10, arrangement of the light source devices 10 is relatively easy to be designed and even distribution of entire optical field is relatively easy to be obtained. As shown in FIG. 8A, the light-emitting chips 110 are disposed around the center of the supporting surface of the substrate 100. In FIG. 8B, the light-emitting chips 110 are disposed arranged in a straight line along a diameter of the supporting surface. One light-emitting chip 110 is located at the center of the supporting surface, and another two light-emitting chips 110 are located on two sides of the light-emitting chip 110 which is at the center of the supporting surface.

Figure 8C:
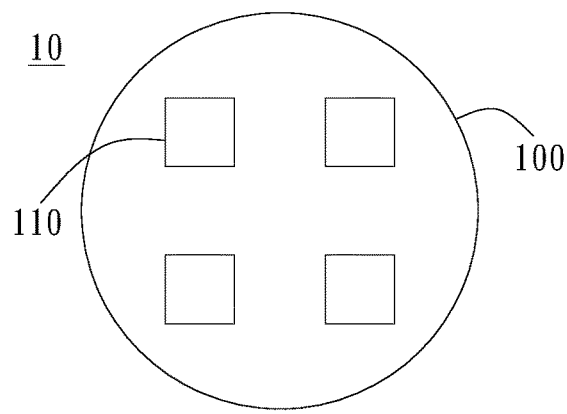
Figure 8D:
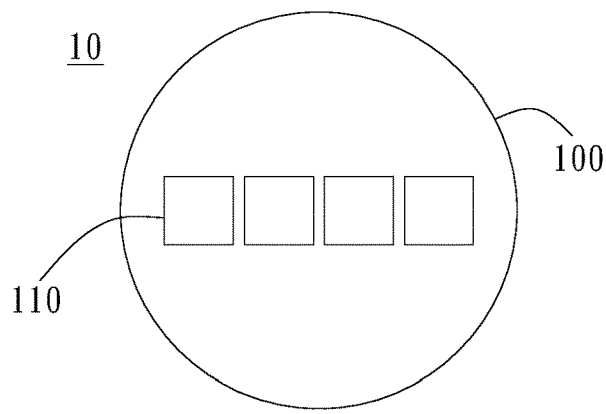
Figure 8E:
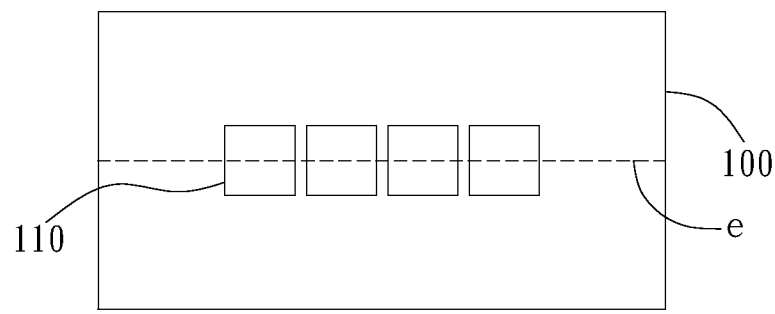
Figure 8F:
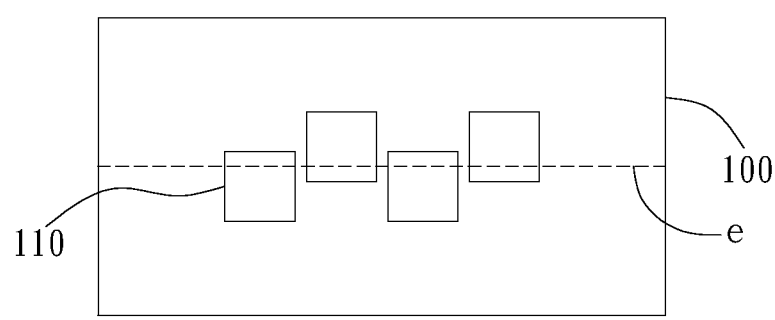

FIG. 8C to FIG. 8F show an example of four light-emitting chips 110. In FIG. 8C, the light-emitting chips 110 are disposed around the center of the supporting surface of the substrate 100. In FIG. 8D, the light-emitting chips 110 are arranged in a straight line along a diameter of the supporting surface, and are symmetrically disposed relative to the center. In FIG. 8E, the light-emitting chips 110 are arranged in a straight line at a position of a connection line (a dashed line (e) in FIG. 8E) of midpoints of short edges of the supporting surface and along a direction parallel to long edges of the supporting surface, and are symmetrically disposed relative to a crossing point of diagonal lines. In FIG. 8F, the light-emitting chips 110 are arranged in a staggered manner at a position of a connection line (a dashed line e in FIG. 8F) of midpoints of short edges of the supporting surface and along a direction parallel to long edges of the supporting surface.

Figure 9:
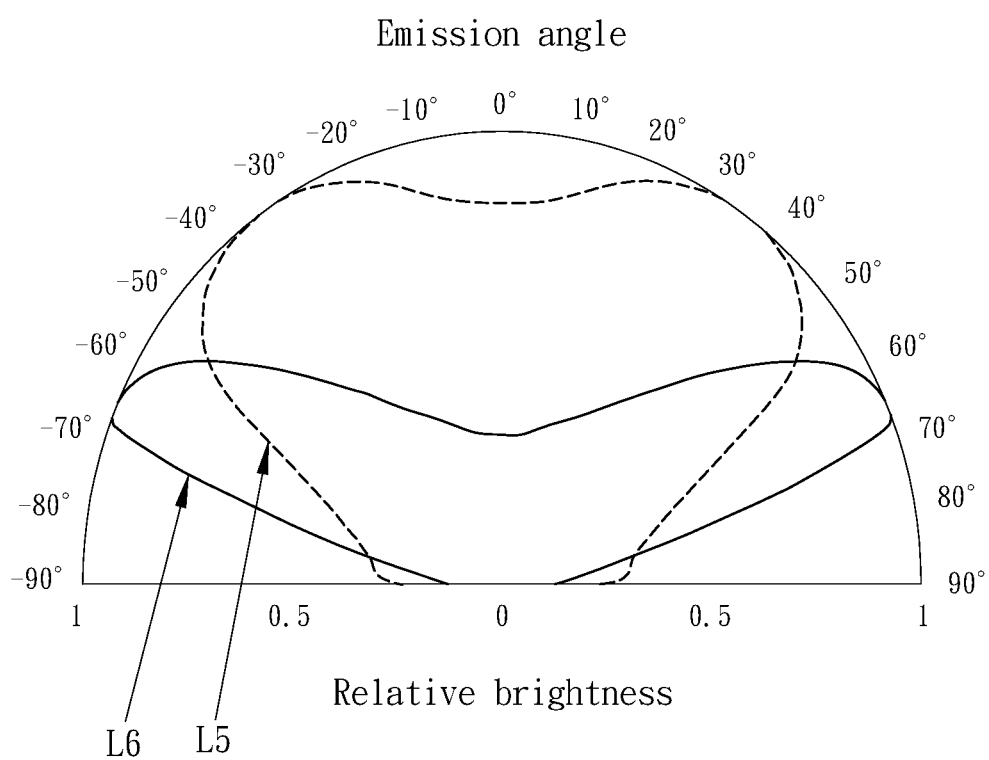
FIG. 9 is a brightness distribution diagram of a light source device.

FIG. 9 is a brightness distribution diagram of a light source device. FIG. 9 shows a measured result of using a display apparatus of the light source device in the present invention. Using a 13.23-inch display device as an example, an optical distance thereof is 11 mm (OD=11 mm). A light-emitting chip has a square shape (side lengths are 0.75 mm*0.75 mm, and a thickness is 0.15 mm). Surfaces of the top cover and the substrate have a square shape (the top cover has a thickness of 0.4 mm, and the substrate has a thickness of 0.4 mm). An encapsulated structure of a transparent sealant (which has side lengths of 2.1 mm*2.1 mm, and has a thickness of 0.6 mm) is tested. As shown in FIG. 9, luminance distribution of the light source device is represented by a curve L6 (a solid line). A luminance distribution curve L5 (a dashed line) uses a light source device without the top cover as a comparison, and which is similar to a structure of an light-emitting diode that can directly perform forward light-emitting. It can be learned from FIG. 9, in the situation (the curve L5) without disposing the top cover, a majority of light concentrates around the normal viewing angle. By using the light source device in the present invention (the curve L6), relative brightness around a normal viewing angle (0°) is reduced, and light is laterally guided. That is, light is emitted at a position whose angle with the normal viewing angle (0°) is larger. As shown in FIG. 9, the curve L6 has a largest relative brightness around +70° and −70°. In can be learned that by using this design, relative brightness of a forward light can be effectively reduced, an optical distance can be shortened, and an entire thickness of a backlight module can be reduced. In this way, light can be prevented from being excessively concentrated on a normal viewing angle, leading to a phenomenon of a bright point or uneven brightness. A lens outside the light source device in the display device can be omitted, and manufacturing costs are reduced.

Although the preferred embodiments of present disclosure have been described herein, the above description is merely illustrative. The preferred embodiments disclosed will not limited the scope of the present disclosure. Further modification of the disclosure herein disclosed will occur to those skilled in the respective arts and all such modifications are deemed to be within the scope of the disclosure as defined by the appended claims.

What is claimed is:

1. A light source device, comprising:
a substrate, having a supporting surface;
a light-emitting chip, disposed on the supporting surface;
a transparent sealant, covering the light-emitting chip and located on the supporting surface, wherein the transparent sealant has a light-emitting surface located outside a side surface of the light-emitting chip; and
a top cover, covering a side of the transparent sealant opposite to the substrate, and clamping the transparent sealant together with the substrate, the light-emitting surface being located between the substrate and the top cover, wherein
a reflectance of the top cover is greater than a transmittance of the top cover, and the transmittance of the top cover is greater than 0.1%;
wherein the transparent sealant has a thickness of twice to six times a thickness of the light-emitting chip.

2. The light source device according to claim 1, wherein the transmittance of the top cover is less than 15%.

3. The light source device according to claim 1, wherein the light-emitting chip has a top surface toward the top cover, and the side surface of the light-emitting chip is toward the light-emitting surface.

4. The light source device according to claim 3, wherein a light-emitting intensity of the side surface is greater than a light-emitting intensity of the top surface.

5. The light source device according to claim 3, wherein a part of the transparent sealant is filled between the top surface of the light-emitting chip and the top cover.

6. The light source device according to claim 3, wherein on a side close to the top cover is an area without the transparent sealant, and the area is substantially located in a vertical projection direction of the top surface toward the top cover, and the area is located between the top cover and the transparent sealant.

7. The light source device according to claim 1, wherein the transparent sealant has a width, and the width gradually reduces in a direction of the substrate toward the top cover.

8. The light source device according to claim 1, wherein the transparent sealant has a thickness of 2.3 times to 4.5 times a thickness of the light-emitting chip.

9. The light source device according to claim 1, wherein the top cover has a thickness of 0.01 mm to 3 mm.

10. The light source device according to claim 1, wherein the top cover has a thickness of 0.05 mm to 0.6 mm.

11. The light source device according to claim 1, wherein the light-emitting chip has a long edge, and the transparent sealant has a largest sectional width of 9.22 times a length of the long edge to the length of the long edge plus 0.04 mm.

12. The light source device according to claim 1, wherein the light-emitting chip has a long edge, and the transparent sealant has a largest sectional width of 3.15 times a length of the long edge to 1.04 times the length of the long edge.

13. The light source device according to claim 1, wherein the light-emitting surface is aligned with a side end surface of the substrate or a side end surface of the top cover.

14. The light source device according to claim 1, wherein the light-emitting surface surrounds the light-emitting chip.

15. The light source device according to claim 1, wherein the supporting surface has a circular shape, and a vertical projection of the light-emitting chip on the supporting surface has a square shape.

16. The light source device according to claim 1, wherein the supporting surface has a square shape, and a vertical projection of the light-emitting chip on the supporting surface has a square shape.

17. The light source device according to claim 1, wherein the supporting surface has a circular shape, and a vertical projection of the light-emitting chip on the supporting surface has a circular shape.

\* \* \* \* \*